United States Patent
Mitani

(10) Patent No.: US 10,157,645 B2
(45) Date of Patent: Dec. 18, 2018

(54) BOOSTER CIRCUIT AND NON-VOLATILE MEMORY INCLUDING THE SAME

(71) Applicant: SII Semiconductor Corporation, Chiba-shi, Chiba (JP)

(72) Inventor: Makoto Mitani, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/784,330

(22) Filed: Oct. 16, 2017

(65) Prior Publication Data
US 2018/0144777 A1 May 24, 2018

(30) Foreign Application Priority Data
Nov. 22, 2016 (JP) .................................. 2016-226978

(51) Int. Cl.
| | | |
|---|---|---|
| G11C 5/14 | (2006.01) | |
| G11C 16/14 | (2006.01) | |
| H02M 3/07 | (2006.01) | |
| G11C 16/30 | (2006.01) | |

(52) U.S. Cl.
CPC .............. *G11C 5/145* (2013.01); *G11C 16/14* (2013.01); *H02M 3/07* (2013.01); *H02M 3/073* (2013.01); *G11C 16/30* (2013.01); *H02M 2003/075* (2013.01); *H02M 2003/078* (2013.01)

(58) Field of Classification Search
CPC ......... G11C 5/145; G11C 16/30; G11C 16/14; H02M 3/07; H02M 2003/078
See application file for complete search history.

(56) References Cited

U.S. PATENT DOCUMENTS 6,278,639 B1 * 8/2001 Hosono .................. G11C 5/145
365/185.23

FOREIGN PATENT DOCUMENTS

JP H11-275855 A 10/1999

* cited by examiner

*Primary Examiner* — Jung Kim
(74) *Attorney, Agent, or Firm* — Brinks Gilson & Lione

(57) ABSTRACT

To obtain a booster circuit capable of reducing voltage stress applied to a booster cell, provided is a booster circuit including a plurality of booster cells connected in series. Each of the plurality of booster cells includes a charge transfer transistor connected between an input terminal and an output terminal, and a boost capacitor connected between the input terminal and a clock terminal. Among the plurality of booster cells, a plurality of booster cells at least in a last stage are connected in parallel so that the plurality of booster cells connected in parallel are connected to a booster cell in a previous stage of the last stage by switching the plurality of booster cells in the last stage in accordance with a boosting operation.

4 Claims, 3 Drawing Sheets

BOOSTER CIRCUIT AND NON-VOLATILE MEMORY INCLUDING THE SAME

RELATED APPLICATIONS

This application claims priority under 35 U.S.C. § 119 to Japanese Patent Application No. 2016-226978 filed on Nov. 22, 2016, the entire content of which is hereby incorporated by reference.

BACKGROUND OF THE INVENTION

1. Field of the Invention

The present invention relates to a booster circuit including a charge transfer transistor and a boost capacitor, and to a non-volatile memory including the booster circuit.

2. Description of the Related Art

An EEPROM which is a non-volatile memory requires a high voltage to rewrite data in a memory cell, and hence includes a booster circuit.

FIG. 3 is a circuit diagram for illustrating a related-art booster circuit.

In the related-art booster circuit, there is adopted a loop connection in which booster cells 51 to 54 are connected in series and output of the booster cell 54 and input of the booster cell 51 are connected to each other. The booster cells 51 to 54 are configured to receive input of clocks CLK1 and CLK2 for boosting and to provide a boosted voltage from an output terminal CPOUT.

The booster cells 51 to 54 include charge transfer transistors 511, 521, 531, and 541 formed of diode-connected NMOS transistors, boost capacitors 512, 522, 532, and 542, changeover switching elements 513, 523, 533, and 543 formed of PMOS transistors, pre-charge elements 514, 524, 534, and 544 formed of diode-connected NMOS transistors, and output elements 515, 525, 535, and 545 formed of diode-connected NMOS transistors, respectively.

A high voltage VPP is necessary to obtain signals HSW11 to HSW14 at H level which are inputs to gates of the changeover switching elements 513, 523, 533, and 543 formed of PMOS transistors. Although not shown, a level shifter circuit is separately required.

The related-art booster circuit is configured to perform a boosting operation as follows.

Any one of the signals HSW11 to HSW14 is set to H level, and the other three thereof are set to L level. For example, a gate voltage of the changeover switching element 543 is set to H level, and gate voltages of the changeover switching elements 513, 523, and 533 are set to L level. Then, the changeover switching element 543 is turned off, and the changeover switching elements 513, 523, and 533 are turned on. At this time, charges are supplied from the pre-charge element 544 of the booster cell 54, and are transferred through the booster cells 51, 52, and 53 in the stated order, and a boosted voltage is provided from the output element 545 of the booster cell 54. In this case, a relationship of potentials of boost nodes N1, N2, N3, and N4 illustrated in FIG. 3 is represented as, in descending order of height, the boost node N3, the boost node N2, the boost node N1, and the boost node N4. The potential of the boost node N3 is the highest, and hence an insulating film between electrodes of the boost capacitor 542 connected to the boost node N3 is subjected to voltage stress the most.

Next, a case in which the gate voltage of the changeover switching element 533 is set to H level and the gate voltages of the changeover switching elements 513, 523, and 543 are set to L level is supposed. The changeover switching element 533 is turned off, and the changeover switching elements 513, 523, and 543 are turned on. At this time, charges are supplied from the pre-charge element 534 of the booster cell 53, and are transferred through the booster cells 54, 51, and 52 in the stated order, and a boosted voltage is an output from the output element 535 of the booster cell 53. In this case, a relationship of the potentials of the boost nodes N1, N2, N3, and N4 is represented as, in descending order of height, the boost node N2, the boost node N1, the boost node N4, and the boost node N3. The potential of the boost node N2 is the highest, and hence an insulating film between electrodes of the boost capacitor 532 connected to the boost node N2 is subjected to voltage stress the most.

In the related-art booster circuit, the output elements are switched to rotate through control of the changeover switching elements after an appropriate number of times of performing the boosting operation. With this, stress applied to the boost capacitors of respective stages may be equalized (see, for example, Japanese Patent Application Laid-open No. Hei 11-275855).

However, optimal design of the charge transfer transistors in the respective booster cells in accordance with the potentials of the respective stages is difficult sine the booster cells are rotated. When the diode-connected NMOS transistors are used as the charge transfer transistors, a threshold voltage increases due to a body effect as charges are transferred to subsequent stages. As a result, charge transfer efficiency deteriorates.

Further, a switch is required in each of the stages in order to rotate the booster cells. Moreover, a non-volatile memory for holding information on the number of times of performing the boosting operation is separately required in order to control a timing at which the booster cells are rotated.

SUMMARY OF THE INVENTION

According to one embodiment of the present invention, there is provided a booster circuit including a plurality of booster cells connected in series, each of the plurality of booster cells including: a charge transfer transistor connected between an input terminal and an output terminal; and a boost capacitor connected between the input terminal and a clock terminal in which, among the plurality of booster cells, a plurality of booster cells at least in a last stage are connected in parallel to connect to a booster cell in a previous stage of the last stage by switching the plurality of booster cells in the last stage in accordance with a boosting operation.

With the booster circuit according to the present invention, a time period in which voltage stress is applied to each of the booster cells in the last stage can be shortened by providing the plurality of booster cells at least in the last stage which are subjected to voltage stress the most, and by switching the booster cells in the last stage in accordance with the boosting operation.

DETAILED DESCRIPTION OF THE PREFERRED EMBODIMENTS

Now, an embodiment of the present invention is described with reference to the drawings.

Figure 1:
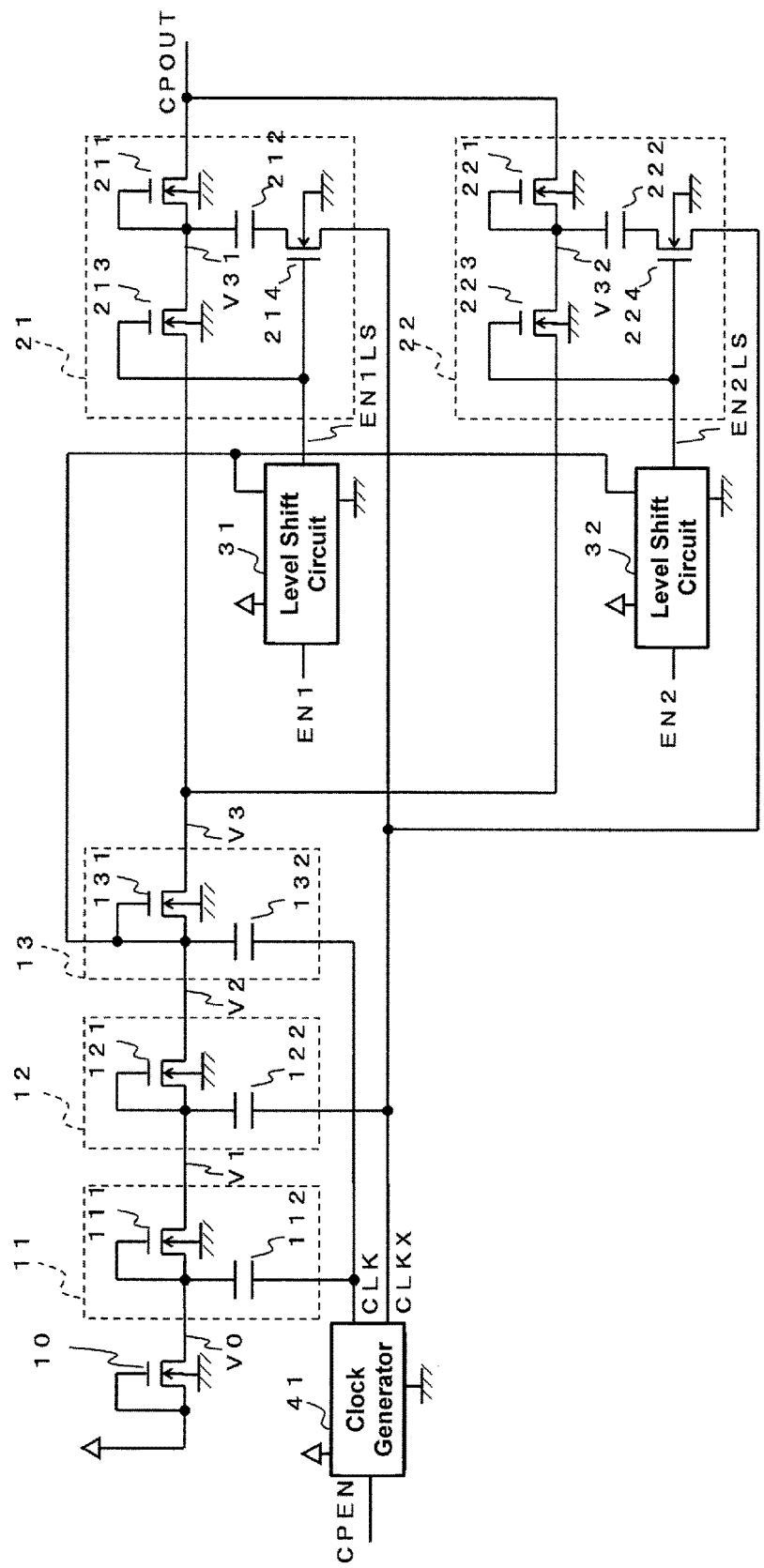
FIG. 1 is a circuit diagram of a booster circuit according to an embodiment of the present invention.

FIG. 1 is a circuit diagram of a booster circuit according to the embodiment of the present invention. The following description is made of a case in which the number of boost stages of the booster circuit is 4 (N=4).

The booster circuit according to this embodiment includes a diode-connected NMOS transistor 10, booster cells 11 to 13, booster cells 21 and 22, level shift circuits 31 and 32, and a clock generator 41.

The booster cells 11 to 13 each include three terminals, namely, an input terminal, an output terminal, and a clock input terminal, and include charge transfer transistors 111, 121, and 131 formed of diode-connected NMOS transistors, and boost capacitors 112, 122, and 132, respectively. Each of the charge transfer transistors 111, 121, and 131 has a gate connected to the input terminal of a corresponding one of the booster cells 11 to 13, a source connected to one terminal of a corresponding one of the boost capacitors 112, 122, and 132, and a drain connected to the output terminal of a corresponding one of the booster cells 11 to 13. Each of the boost capacitors 112, 122, and 132 has another terminal connected to the clock input terminal of a corresponding one of the booster cells 11 to 13.

The booster cells 21 and 22 each include four terminals, namely, an input terminal, an output terminal, a clock input terminal, and a selection terminal, and include charge transfer transistors 211 and 221 formed of diode-connected NMOS transistors, boost capacitors 212 and 222, path selection switches 213 and 223 formed of NMOS transistors, and boost capacitor selection switches 214 and 224 formed of NMOS transistors, respectively.

Each of the charge transfer transistors 211 and 221 has a gate and a source both connected to one terminal of a corresponding one of the boost capacitors 212 and 222, and to a drain of a corresponding one of the path selection switches 213 and 223, and a drain connected to the output terminal of a corresponding one of the booster cells 21 and 22. Each of the boost capacitors 212 and 222 has another terminal connected to a source of a corresponding one of the boost capacitor selection switches 214 and 224. Each of the path selection switches 213 and 223 has a source connected to the input terminal of a corresponding one of the booster cells 21 and 22. Each of the boost capacitor selection switches 214 and 224 has a drain connected to the clock input terminal of a corresponding one of the booster cells 21 and 22. Each of the path selection switches 213 and 223 has a gate connected to the selection terminal of a corresponding one of the booster cells 21 and 22. Each of the boost capacitor selection switches 214 and 224 has a gate connected to the selection terminal of a corresponding one of the booster cells 21 and 22.

The level shift circuits 31 and 32 each include five terminals, namely, an input terminal, an output terminal, a first power supply terminal, a second power supply terminal, and a GND terminal. A signal EN1 or EN2 is an input to the input terminal which falls within a voltage range between a voltage at the first power supply terminal and a voltage at the GND terminal. A signal EN1LS or EN2LS is an output from the output terminal which falls within a voltage range between a voltage at the second power supply terminal and the voltage at the GND terminal.

The clock generator 41 includes five terminals, namely, an enable terminal, a first clock output terminal, a second clock output terminal, a power supply terminal, and a GND terminal. The clock generator 41 receives input of a signal CPEN to the enable terminal. The clock generator 41 has the first clock output terminal connected to the clock input terminals of the booster cells 11 and 13, and has the second clock output terminal connected to the clock input terminals of the booster cells 12, 21, and 22. When a signal CPEN at H level is given to the enable terminal, a clock signal CLK is an output from the first clock output terminal, and a clock signal CLKX is an output from the second clock output terminal. When a signal CPEN at L level is given to the enable terminal, output of clock signals is stopped. The clock signal CLK and the clock signal CLKX are signals having phases opposite to each other.

The NMOS transistor 10 which is the input terminal of the booster circuit is connected to a power supply terminal (power supply voltage Vcc). Further, the booster cells 11 to 13 are connected in series in three stages. The booster cell 21 and the booster cell 22 are connected in parallel in the subsequent stage of the booster cell 13 being the last stage of the three stages connected in series, and provide a boosted voltage from an output terminal CPOUT. Nodes of the booster cells 11, 12, 13, 21, and 22 are referred to as V0, V1, V2, V3, V31, and V32.

The signals EN1 and EN2 pass through the level shift circuits 31 and 32, and are inputs to the selection terminals of the booster cells 21 and 22 as level-shifted signals EN1LS and EN2LS, respectively. In this case, the level shift circuits 31 and 32 convert the signals EN1 and EN2 which are logic signals having a level between the power supply voltage Vcc and the voltage at the GND terminal, into the signals EN1LS and EN2LS which are logic signals having a level between the voltage at the node V2 and the voltage at the GND terminal.

The booster circuit according to this embodiment is configured to perform a boosting operation as follows.

When the clock signal CLK is at L level and the clock signal CLKX is at H level, the boost capacitor 112 is charged with the power supply voltage Vcc via the NMOS transistor 10. Next, when the clock signals CLK and CLKX are inverted, charges of the boost capacitor 112 are transferred via the charge transfer transistor 111, and the boost capacitor 122 is thus charged. After that, the charging and transfer are repeatedly performed, and the booster circuit thus boosts a voltage based on the power supply voltage Vcc.

When the booster cell 21 is selected to perform the boosting operation, the signal EN1 is set to H level, and the signal EN2 is set to L level. Then, the signal EN1LS also becomes H level, and the path selection switch 213 and the boost capacitor selection switch 214 are turned on. Similarly, when the booster cell 22 is selected to perform the boosting operation, the signal EN1 is set to L level, and the signal EN2 is set to H level. Then, the signal EN2LS also becomes H level, and the path selection switch 223 and the boost capacitor selection switch 224 are turned on. After that, the charging and transfer are repeatedly performed by the selected booster cell, and the boosting operation is thus performed.

When receiving a write command from the outside, an EEPROM having the booster circuit according to this embodiment mounted thereon rewrites data in a memory cell by activating the booster circuit and generating an internal boosted voltage.

Figure 2:
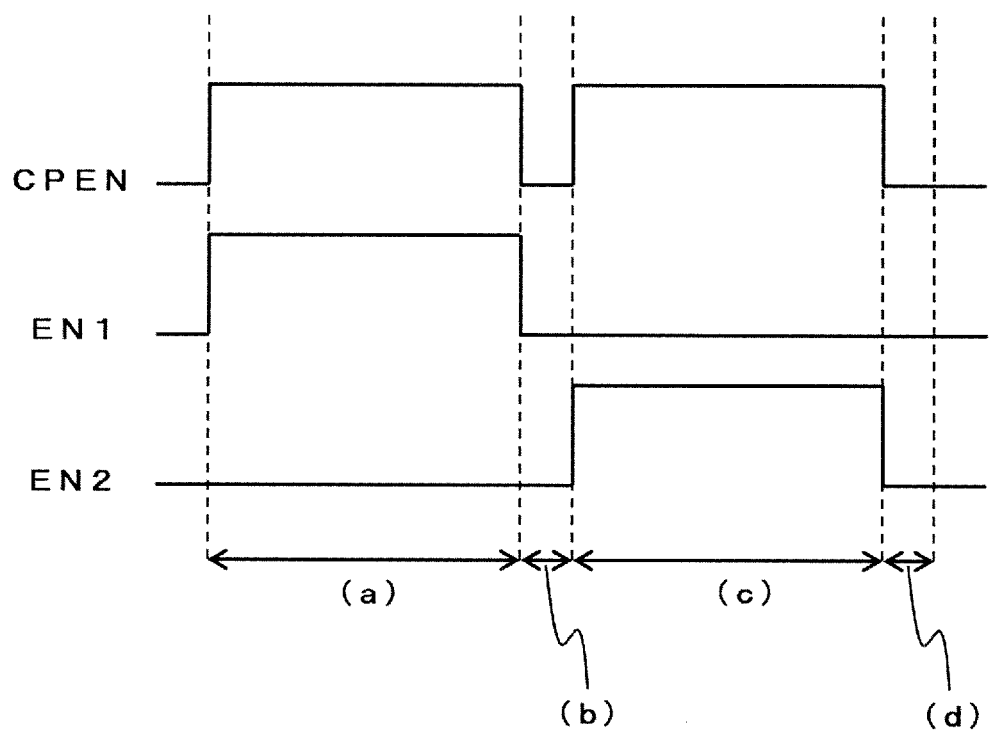
FIG. 2 is a timing chart for illustrating an example of an operation of an EEPROM having the booster circuit mounted thereon.
Figure 3:
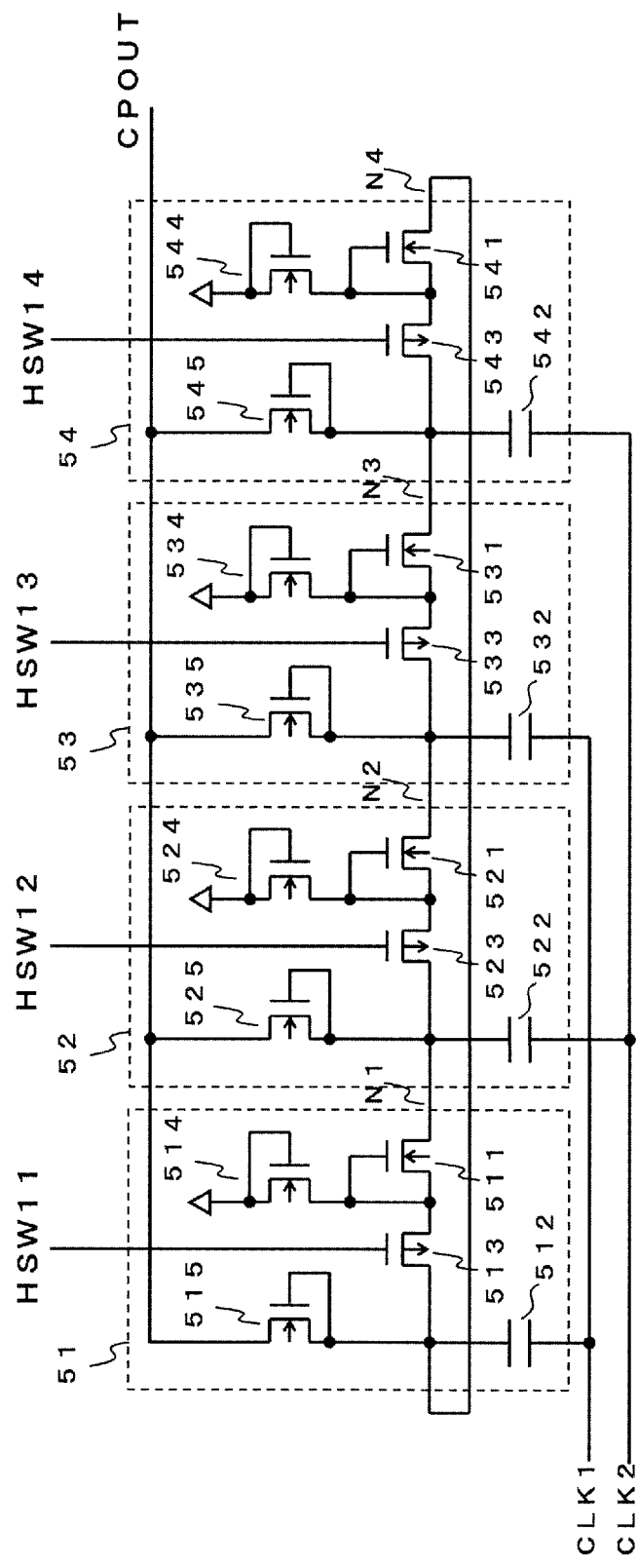
FIG. 3 is a circuit diagram for illustrating a related-art booster circuit.

FIG. 2 is a timing chart for illustrating an example of an operation of the EEPROM having the booster circuit mounted thereon.

The operation of the EEPROM includes four periods, namely, (a) erase period, (b) discharge period, (c) write period, and (d) discharge period. In one rewrite operation, the EEPROM performs the boosting operation in two periods, namely, (a) erase period and (c) write period.

In (a) erase period, the signal CPEN becomes H level, and the boosting operation is thus started. At this time, the booster cell 21 is selected by setting the signal EN1 to H level and the signal EN2 to L level. In (b) discharge period, a first boosting operation is brought to an end by setting the signal CPEN and the signal EN1 to L level. Although not shown, a discharge circuit is separately activated, and each of the boost nodes discharges the voltage to a level of the power supply voltage Vcc. In (c) write period, the signal CPEN becomes H level again, and the boosting operation is thus started. At this time, the booster cell 22 is selected by setting the signal EN1 to L level and the signal EN2 to H level. In (d) discharge period, a second boosting operation is brought to an end by setting the signal CPEN and the signal EN2 to L level, and each of the boost nodes discharges the voltage to the level of the power supply voltage Vcc. In this way, rewriting of data in the memory cell is completed.

At this time, the boost nodes at which the voltage becomes the highest are the boost nodes V3, V31, and V32. The charge transfer transistors 211 and 221 and the boost capacitors 212 and 222 which have the gate electrodes connected to those boost nodes are elements subjected to voltage stress the most. The booster circuit according to this embodiment enables reduction of the frequency in use of those elements by half, and thus enables reduction of a time period in which voltage stress is applied to those elements by half, by using the charge transfer transistor 211 and the boost capacitor 212 in (a) erase period and using the charge transfer transistor 221 and the boost capacitor 222 in (c) write period.

As described above, with the booster circuit according to this embodiment, a time period in which voltage stress is applied to the booster cells in the last stage can be reduced by half by providing two booster cells in the last stage which are subjected to voltage stress the most and switching the booster cells in the last stage.

Further, in the booster circuit according to this embodiment, the stage at which each of the booster cells is located is fixed, and hence a threshold value and a channel length of each of the charge transfer transistors may be optimally designed. Moreover, the selection of the booster cell is performed only in the last stage, and hence a switching element and a level shift circuit may be omitted for other stages.

In this embodiment, the number of boost stages is set to N=4, but the number of boost stages may be set to any appropriate number. Further, the booster cells are switched only in the last stage, but it is also possible to provide a plurality of stages in which booster cells are connected in parallel, and to switch the plurality of stages. With this configuration, a booster circuit in which voltage stress is further reduced may be achieved.

Moreover, in this embodiment, description has been made of a configuration in which two booster cells are provided in parallel and switched to each other, but the number of the booster cells is not limited to two. There may be employed a configuration in which two or more booster cells are provided in parallel and switched to one another.

What is claimed is:

1. A booster circuit, comprising:
   first booster cells; and
   two second booster cells, the first booster cells each comprising:
   a first charge transfer transistor connected between a first input terminal and a first output terminal; and
   a boost capacitor connected between the first input terminal and a clock terminal,
   the two second booster cells each comprising:
   a second charge transfer transistor, in which one terminal of a first switching element is connected to a second input terminal and a control terminal of the first switching element is connected to an enable terminal, the second charge transfer transistor being connected between another terminal of the first switching element and a second output terminal;
   a second boost capacitor having one terminal connected to the another terminal of the first switching element; and
   a second switching element in which the enable terminal is connected to a control terminal of the second switching element. the second switching element being connected between a clock terminal and another terminal of the second boost capacitor,
   the first booster cells being connected in series in a first stage to a previous stage of a last stage,
   the two second booster cells being connected in parallel in the last stage, and
   the booster circuit having a function to turn on one of the two second booster cells and turn off another one of the two second booster cells in accordance with a boosting operation.

2. A booster circuit according to claim 1, further comprising a level shift circuit configured to convert a signal level of an input to the enable terminal of each of the two second booster cells into a level of a voltage at the first input terminal of the first booster cell in the previous stage of the last stage.

3. A non-volatile memory, comprising the booster circuit of claim 1.

4. A non-volatile memory, comprising the booster circuit of claim 2.

* * * * *